United States Patent [19]

Sacks

[11] 4,353,058

[45] Oct. 5, 1982

[54] DIGITAL TO ANALOG CONVERTER HAVING AN ANALOG TO DIGITAL CONVERTER PORTION FOR AN AC OPERATION OR A DC OPERATION

[75] Inventor: Sidney M. Sacks, Monsey, N.Y.

[73] Assignee: The Singer Company, Little Falls, N.J.

[21] Appl. No.: 148,118

[22] Filed: May 9, 1980

[51] Int. Cl.³ .............................................. H03K 13/02
[52] U.S. Cl. ...................... 340/347 CC; 340/347 DA; 340/347 AD; 340/870.21
[58] Field of Search .... 340/347 M, 347 DA, 347 CC, 340/870.21

[56] References Cited

U.S. PATENT DOCUMENTS 4,272,760  6/1981  Prazak et al. .............. 340/347 M X

FOREIGN PATENT DOCUMENTS 2814754  10/1978  Fed. Rep. of Germany ...... 340/347 DA

OTHER PUBLICATIONS

Gellender, Learn Microprocessor Fundamentals, Electronic Design 21, Oct. 11, 1977, pp. 74-79.
The Engineering Staff of Analog Devices, Inc., Analog-Digital Conversion Handbook, 6/72, pp. III-52 to III-57; III-73 to III-81.

Primary Examiner—Thomas J. Sloyan
Attorney, Agent, or Firm—Thomas W. Kennedy

[57] ABSTRACT

A digital to analog converter is provided, for making a digital to analog conversion, and including, an analog to digital converter portion which may be an existing converter, an arithmetic logic unit which is coupled to the analog to digital converter portion, a digital to dc converter portion which is coupled to the arithmetic logic unit, an ac multiplex circuit for an ac operation which is adapted to be coupled to the digital to dc converter portion, a dc multiplex circuit for a dc operation which is adapted to be coupled to the digital to dc converter portion, a switch which couples either the ac multiplex circuit or the dc multiplex circuit to the digital to dc converter portion and which is coupled to and operated by the arithmetic logic unit, and a multiplex control which is actuated by the analog to digital converter portion and which is coupled to the ac multiplex circuit and to the dc multiplex circuit for controlling the output signals from the ac circuit and dc circuit to the analog to digital converter portion.

2 Claims, 4 Drawing Figures

DIGITAL TO ANALOG CONVERTER HAVING AN ANALOG TO DIGITAL CONVERTER PORTION FOR AN AC OPERATION OR A DC OPERATION

BACKGROUND OF THE INVENTION

This invention relates to a digital to analog converter having an analog to digital converter portion for making a digital to analog conversion in either an ac operation or a dc operation, and particularly to a digital to analog converter having an analog to digital converter portion, and having an arithmetic logic unit, a digital to dc converter portion, ac circuit means, dc circuit means, and switch means, for making a digital to analog conversion in either an ac operation or a dc operation.

The prior art digital to analog converter, which is used with an existing analog to digital converter, requires a separate digital to analog converter having sample and hold amplifiers for making a digital to analog conversion in a dc operation, and requires a separate, individual digital to analog converter for each output channel for making a digital to analog conversion in an ac operation.

One problem with the prior art digital to analog converter, which is used with an analog to digital converter, is the difficulty of designing and providing a simple, low cost, digital to analog converter, which can be adapted to use an existing analog to digital converter as an operating part thereof, and which has fewer and simpler parts than the prior art digital to analog converter.

SUMMARY OF THE INVENTION

According to the present invention, a novel digital to analog converter is provided by using, in combination, an analog to digital converter, an arithmetic logic unit, which is coupled to the analog to digital converter, a digital to dc converter, which is coupled to the arithmetic logic unit, ac circuit means, which can be coupled to the digital to dc converter for ac operation, dc circuit means, which can be coupled to the digital to dc converter for dc operation, and switch means for alternately coupling the ac circuit means or the dc circuit means to the digital to dc converter.

Accordingly, it is one object of the present invention to provide, in combination, a digital to analog converter and an analog to digital converter.

It is another object of the invention to provide a digital to analog converter, which uses an analog to digital converter portion, for making a digital to analog conversion.

It is a further object of the invention to provide a digital to analog converter, which has an analog to digital converter portion, for making a digital to analog conversion, in either an ac operation or a dc operation.

It is a still further object of the invention to provide a digital to analog converter, which can use an existing analog to digital converter, for making a digital to analog conversion, for either an ac operation, or a dc operation.

Further objects of the present invention will become apparent from the following description of a specific embodiment, which is shown in the drawings that are described hereafter.

DESCRIPTION OF THE PREFERRED EMBODIMENT

Figure 1:
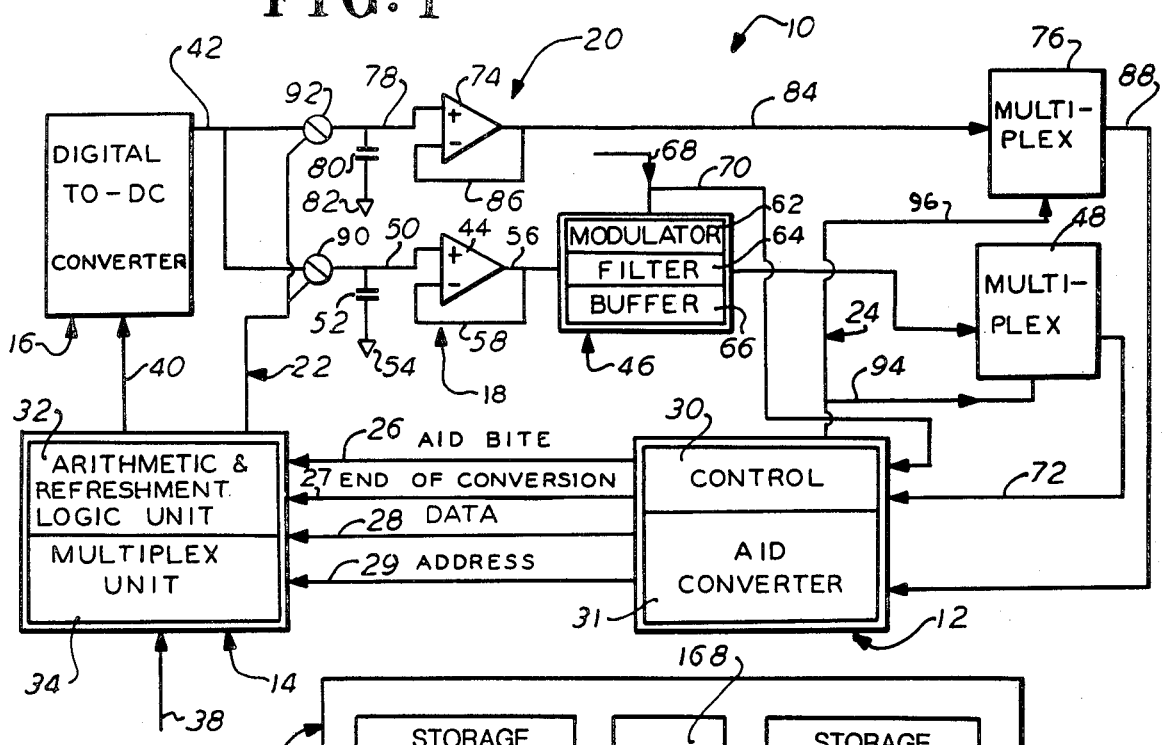
FIG. 1 is a schematic drawing, in a block diagram form, of a digital to analog converter embodying features of the present invention.

Referring to FIG. 1, one embodiment of the present invention is a digital to analog converter 10 for making a digital to analog conversion, in either an ac operation, or in a dc operation.

Converter 10 includes an analog to digital converter portion 12, an arithmetic logic unit 14, a digital to dc converter portion 16, an ac multiplex operating circuit means 18, for ac operation, a dc multiplex operating circuit means 20, for dc operation, switch means 22 for coupling either the ac circuit means 18 or the dc circuit means 20 to the digital to dc converter portion 16, and a multiplex control means 24 for controlling the output from ac circuit means 18 or dc circuit means 20.

Analog to digital converter portion 12, which may be an existing analog to digital converter unit, provides both ac and dc conversions, and has a relatively high accuracy.

The construction of analog to digital converter portion 12 is preferably similar to the construction, as shown and described in U.S. Pat. Nos. 3,438,026, or 3,500,384 or 3,581,304, which are assigned to the same assignee as in this application.

Converter portion 12 has an analog to digital (A/D) BITE (built-in test equipment) connector 26, an end of conversion connector 27, a data connector 28, and an address connector 29, which respectively connect to arithmetic logic unit 14.

Converter portion 12 has a multiplex control section 30, which connects to multiplex control means 24, and has an analog to digital converter section 31.

Arithmetic logic unit 14 includes an arithmetic and refreshment logic section 32 and a logic multiplex section 34. Arithmetic logic unit 14 has an input 38, which receives the commanded input data and address input. Arithmetic logic unit 14 also has an output 40, which has the corrected data that is the input data to digital to dc converter portion 16. Arithmetic logic unit 14 is used to update each channel which it supplies.

Digital to dc converter portion 16 includes an output 42, which is connected by switch means 22 to ac circuit means 18 and dc circuit means 20. Digital to dc converter portion 16 requires only compatible resolution and monotonicity with the analog to digital converter portion 12.

AC circuit means 18 includes a plurality of parallel ac channels, one of which is shown in FIG. 1. AC circuit 18 includes a plurality of sample and hold amplifiers 44, one of which is shown for the channel in FIG. 1. Amplifier 44 connects to the digital to dc converter portion output 42. AC circuit 18 also includes a plurality of modulator and filter and buffer amplifiers 46, one of which is shown in FIG. 1. Modulator amplifier 46 connects to its sample and hold amplifier 44. AC circuit 18 also includes an ac multiplex unit 48, which connects to the plurality of modulator amplifiers 46.

Each sample and hold amplifier 44 has a positive input connector 50, which has a capacitor 52 that connects to a ground 54. Each sample and hold amplifier 44 also has an output connector 56, which connects to its respective modulator amplifier 46, and has a negative connector 58, which connects to output connector 56.

Switch means 22, which connects the respective connector 50 of the selected ac channel to output 42, is controlled by logic unit 14. When connector 50 is connected to output 42, the signal from converter 16 is received by amplifier 44 and is retained in capacitor 52.

Each modulator amplifier 46 has an output connector 60, which is connected to multiplex unit 48. Each modulator amplifier 46 also has a modulator section 62, a filter section 64, and a buffer section 66. Each modulator amplifier 46 also has an ac reference portion 68, which has a connector 70, that connects to analog to digital converter 12.

Multiplex unit 48, which is a single unit, connects to the plurality of connectors 60, each of which is part of its separate ac channel. AC multiplex unit 48 has a single output connector 72, which connects to analog to digital converter 12. Multiplex unit 48 is connected to and controlled by multiplex control means 24, which connects output connector 72 to the selected channel connector 60. When multiplex control 24 connects connector 72 to connector 60, the signal in amplifier 44 and capacitor 52 passes to converter 12 and then to logic unit 14.

DC circuit means 20 includes a plurality of parallel dc channels, one of which is shown in FIG. 1. DC circuit 20 includes a plurality of sample and hold amplifiers 74, one of which is shown in FIG. 1. Sample and hold amplifier 74 connects to the output 42 of digital to dc converter portion 16. DC circuit 20 also includes a dc multiplex unit 76 which connects to amplifiers 74.

Each sample and hold amplifier 74 has a positive input connector 78, which has a capacitor 80 that connects to a ground 82. Each sample and hold amplifier 74 also has an output connector 84, which connects to the dc multiplex unit 76, and a negative connector 86, which connects to connector 84.

Switch means 22, which connects connector 78 to output 42, is controlled by logic unit 14. When connector 78 is connected to output 42, the signal from converter 16 is received by amplifier 74 and is retained in capacitor 80.

DC multiplex unit 76 has a single output connector 88, which connects to analog to digital converter 12. DC multiplex unit 76 is connected to and controlled by multiplex control means 24, which connects output connector 88 to the selected channel connector 84. When control 24 connects connector 88 to connector 84, the signal in amplifier 74 and capacitor 80 passes to converter 12 and then to logic unit 14.

Switch means 22 includes an ac switch unit 90 for each ac connector 50, and a dc switch unit 92 for each dc connector 78. Each ac and dc channel has a separate switch unit, so that all channels are controlled by switch means 22.

Multiplex control means 24 includes a typical ac input connector 94 for each ac channel, which supplies a control on ac multiplex unit 48 from control section 30 of converter portion 12. Multiplex control means 24 also includes a typical dc input connector 96 for each dc channel, which supplies a control on dc multiplex unit 76 from control section 30 of converter portion 12.

In this way, multiplex control 24, which is controlled by section 30 of converter 12, controls the signals from converter portion 16, through converter portion 12, to logic unit 14. If the value of the signal from converter portion 12 to logic unit 14, is more or less, than the commanded value of the signal which enters input 38, then the difference from such commanded value is added or subtracted thereto, and the amended commanded value, or corrected data, is supplied through output 40 to converter portion 16. Thus, converted data of the output connectors 72,88 of circuits 18,20 is routed back to logic unit 14, where comparisons are made to the commanded data entering input 38, and appropriate channel corrections are provided through output 40 to the digital to dc converter 16.

In operation, converter 10, in FIG. 1, proceeds in the manner as indicated hereafter.

1. Upon the turn-on of the initial power, zero output data is provided through the arithmetic logic unit 14 to all channels of ac circuit 18 and dc circuit 20. The routine of arithmetic logic unit 14 transfers the nominal zero output on the output sample and hold amplifiers 44 of ac channel 18 and on the output sample and hold amplifiers 74 of dc channel 20. Due to the component accuracies, each output will be in error by the accuracies of the digital to dc converter 16, sample and hold amplifiers 44, 74 and modulator amplifier 46.

2. When this error voltage is converted in the analog to digital converter portion 12, it provides digital data back to logic unit 14, which is proportional to the error voltage.

3. Arithmetic logic unit 14 compares the results of the analog to digital converter portion 12 to the commanded input data from input 38, for the associated output channel, and calculates a digital difference.

4. The calculated digital difference is then appropriately added, or subtracted, to the commanded data entering input 38 to provide a corrected digital command to the digital to dc converter 16 to reduce the calculated digital difference toward zero. In this manner, any offset of gain errors associated with the digital to analog output circuits 18, 20 will be corrected to within the accuracy of the analog to digital converter portion 12.

5. The analog to digital converter portion 12 provides a BITE signal through BITE connector 26 to the arithmetic logic unit 14 as a function of its internal operation. If this BITE signal indicates an accuracy or malfunction of the converter portion 12, then the corrected data at output connector 40 will only utilize the commanded input data at input 38. This will continue to provide all of the data outputs required at output connector 40, although at a reduced accuracy.

Figure 2:
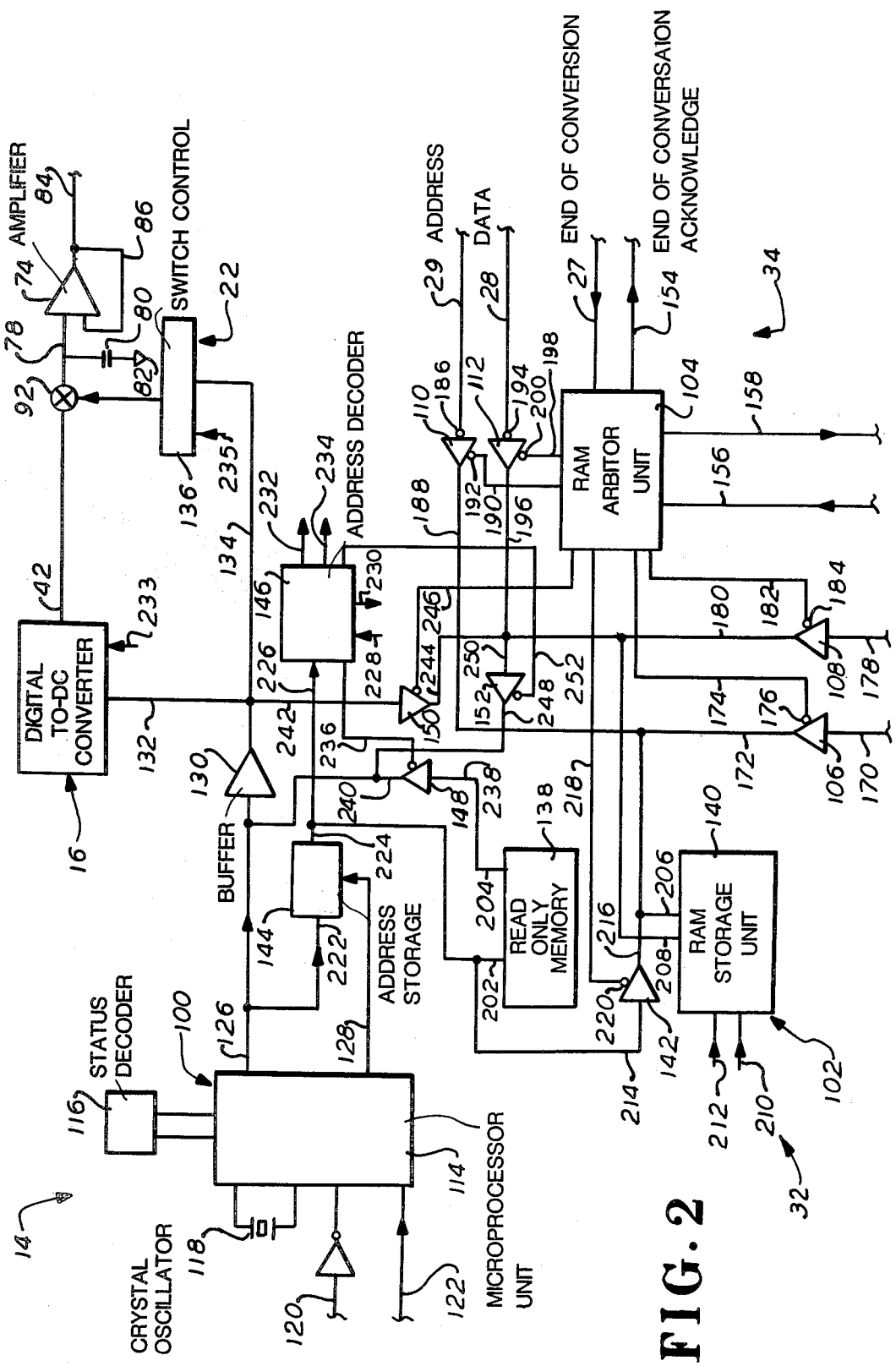
FIG. 2 is a detail drawing, in a block diagram form, of an arithmetic logic unit, which is a portion of the digital to analog converter of FIG. 1.

FIG. 2 is a detail drawing, in block diagram form, which shows the details of arithmetic logic unit 14, including its sections 32 and 34, and which shows connecting, parts of converter portion 16 and switch means 22.

Arithmetic and refreshment logic section 32 of unit 14 includes a sixteen-bit microprocessor assembly 100 and a program memory assembly 102.

Logic multiplex section 34 includes a random access memory (RAM) arbitor unit 104, a digital to dc address tri-state gate assembly 106, a digital to dc data tri-state gate assembly 108, and analog to digital address tri-state gate 110, and an analog to digital data tri-state gate 112.

In FIG. 2, microprocessor assembly 100 includes a microprocessor unit 114, a status decoder 116, a crystal oscillator 118. Microprocessor 100 also includes a logic reset gate 120, and a real time interrupt clock input line 122. Microprocessor 100 also includes sixteen data or address input and output lines 126, and an address enable line 128. Microprocessor 100 connects to a buffer unit 130 through its sixteen conductor data or address input and output line 126. Buffer 130 connects to output line 40 and switch 22 through data line 132 to the digital to dc converter 16, and through switch line 134 to a digital to dc mux switch control 136 in switch unit 22.

In FIG. 2, program memory assembly 102 includes read only memory (ROM) unit 138, random access memory (RAM) storage unit 140, RAM tri-state gate enable unit 142, address storage unit 144, address decoder and select unit 146, ROM data tri-state gate assembly 148, microprocessor data tri-state gate assembly 150, and interface data tri-state gate assembly 152.

RAM arbitor unit 104, which connects to end of conversion line 27, has a related end of conversion acknowledge line 154. RAM arbitor unit 104 also has a sixteen conductor input write line 156 and a sixteen conductor acknowledge line 158.

Figure 3:
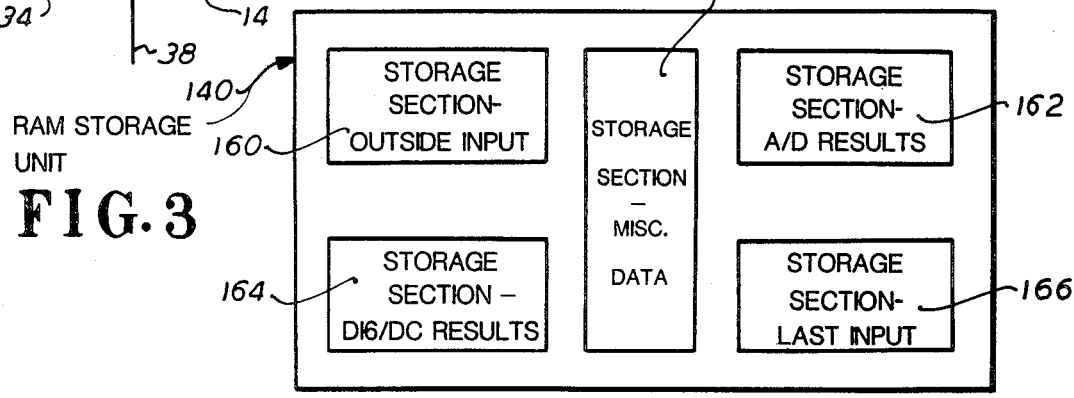
FIG. 3 is a detail drawing in a schematic form, of a RAM unit, which is a portion of the arithmetic logic unit of FIG. 2.
Figure 4:
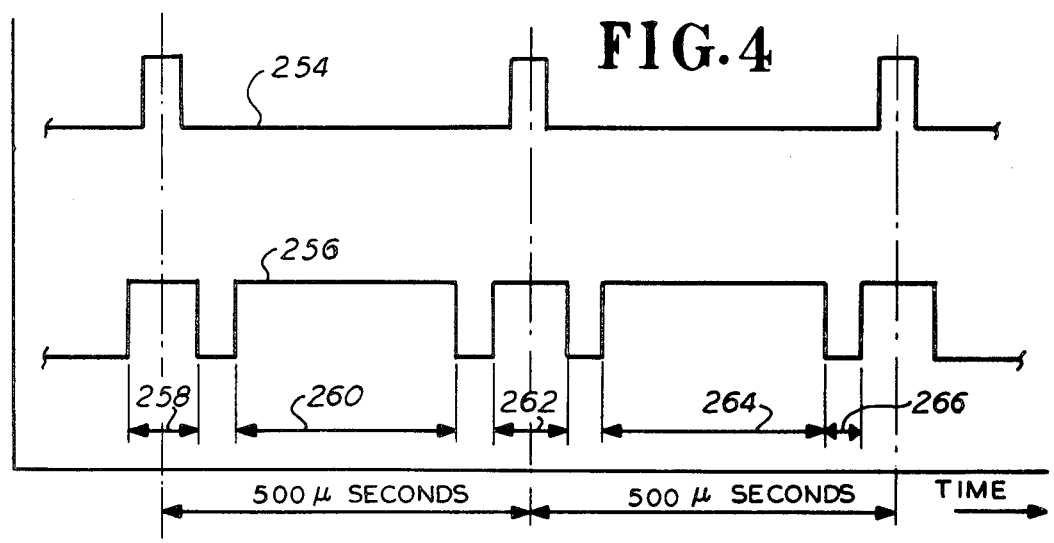
FIG. 4 is a graph, having a first curve of real time clock sequence versus time, and having a second curve of corresponding event sequence versus time for demonstration the timing sequence of the digital to analog converter.

A description of FIGS. 2, 3 and 4 is given hereafter, before describing the lines which connect to the various parts within FIG. 2.

As shown in FIG. 3, RAM storage unit 140 includes storage section 160, which contains the latest commanded input data from the outside world, storage section 162, which contains the results of the analog to digital conversions, storage section 164, which contains the calculated results and commanded output from the digital to dc converter portion 16, storage section 166, which contains the last commanded input data from the outside world, and storage section 168, which contains the miscellaneous data and constants.

FIG. 2 is the block diagram of the arithmetic logic unit 14 of the proposed converter 10. The approach represented in this block diagram, as shown in FIG. 2, proposes the use of microprocessor assembly 100 for timing, control and calculation. This approach assumes that independent multiplexing and timing and control exist for the analog to digital converter portion 12 and that the timing and control, of the microprocessor assembly 100, the input commands of the digital to dc converter portion 16 and the analog to digital converter portion 12 all operate independently and asynchronously.

The RAM arbitor unit 104 assigns access priority to each device requesting storage in RAM storage unit 140, and controls the data flow in an orderly manner. In this manner, the RAM storage unit 140 is shared between these devices 12, 16 and 100.

FIG. 3 illustrates the four basic data blocks stored in RAM storage unit 140, namely the last commanded input data stored in section 166, the latest commanded input data stored in section 160, the A/D converted results stored in section 162, and the digital to dc commanded output, stored in section 164, to reduce the difference between the commanded input in section 160 and A/D results in section 162 to zero. In addition, the software will be arranged to compare difference between the latest commanded data in section 160, and previous commanded data. If this difference is greater than a particular amount, the latest commanded data will replace the calculated result to speed up output response to larger data input step changes.

The remainder of the logic and control section consists of a microprocessor 114, ROM program memory 138, and multiple input and output tri-state data and address ports and controls.

FIG. 4 shows the basic timing sequence proposed. A real time clock (not shown) which connects to real time interrupt line 122, is used as an interrupt to the microprocessor 100, which initiates a repetitive sequence consisting of updating the digital to dc output converter portion 16 for 500 useconds then closing the appropriate digital to dc output switch port for an additional 500 useconds to update the associated output channel. The time between these input and output operations is utilized to calculate the next output channel required data value, as well as run internal BITE checks for proper microprocessor timing, control, RAM data operations, and ROM data operations. Successive pairs of real time interrupts continues sequentially to update all of the required output channels.

The ROM memory unit 138 in FIG. 2 contains the basic program for providing the output updates of each channel and utilizes the various sections of RAM storage unit 140 to secure any data required for calculation and storage results.

Referring again to FIG. 2, the various lines to and from each part of logic unit 14 are described in more detail hereafter.

Digital to dc address tri-state gate assembly 106 includes a sixteen conductor address bit line 170, a sixteen conductor RAM address bus line 172, a sixteen conductor RAM data bus line 174, and one arbitor select control unit 176.

Digital to dc data tri-state gate assembly 108 includes a sixteen conductor data bit line 178, a sixteen conductor RAM address bite line 180, a sixteen conductor RAM data bus line 182, and one arbitor select control unit 184.

Analog to digital address tri-state gate 110 includes a sixteen conductor address bit line terminal 186, which connects to line 29, a sixteen conductor RAM address bus line 188, a sixteen conductor RAM data bus line 190, and one arbitor select control unit 192.

Analog to digital data tri-state gate 112 includes a sixteen conductor address bit line terminal 194, sixteen conductor RAM address bus line 196, sixteen conductor RAM data bus line 198, and one arbitor select control unit 200.

The sixteen conductor address bit line 170, sixteen conductor data bit line 178, sixteen conductor input write line 156, and sixteen conductor acknowledge line 158, form an input, which is an interface input to digital to dc converter portion 16.

In FIG. 2, the ROM memory unit 138 includes a sixteen conductor address bit line 202, and a sixteen conductor data bit line 204.

RAM storage unit 140 includes a sixteen conductor address bit line 206, a sixteen conductor data input or output line 208, one enable line 210, and one read or write line 212.

RAM tri-state gate enable unit 142 includes a sixteen conductor data bit line 214, a sixteen conductor RAM address bit line 216, a sixteen conductor RAM data bit line 218, and one arbitor select control unit 220.

Address storage unit 144 includes a sixteen conductor address input bit line 222, and a sixteen conductor address output bit line 224.

Address decoder and select unit 146 includes a sixteen conductor address input bit line 226, one memory read bit line 228, and one memory write bit line 230.

Unit 146 also includes a select enable line 232, which connects to a digital to dc converter select line 233, a select enable line 234, which connects to a switch select line 235, and a select enable line 236, which connects to gate 148.

In FIG. 2, the ROM data tri-state gate assembly 148 includes a sixteen conductor data input line 238, a sixteen conductor data output line 240, and the one connecting enable line 236.

Microprocessor data tri-state gate assembly 150 includes a sixteen conductor data input line 242, a sixteen conductor data output line 244, and one enable line 246.

Interface data tri-state gate assembly 152 includes a sixteen conductor data input line 248, a sixteen conductor data output line 250, and one enable line 252.

In order to construct the preferred embodiment of arithmetic logic unit 14, as shown in FIG. 2, the part manufacturers and their part numbers are listed hereafter.

PARTS LIST

| Title and Numeral | Name of Manufacturer | Manufacturer's Part Number |
|---|---|---|
| Microprocessor assembly 100 | Intel | M 8085 A |
| Read only memory ROM unit 138 | Intel | 2716 (1Kx8 ROM) |
| Random access memory RAM unit 140 | Intel | 2114 (1Kx8 RAM) |
| RAM tri-state gate enable unit 142 | Texas Instruments | 54 LS 5367 |
| Address storage unit 144 | Intel | M 8212 |
| Address decoder and select unit 146 | Texas Instruments | 54 LS 368 |
| ROM data tri-state gate assembly | Texas Instruments | 54 LS 367 |
| Microprocessor data tri-state gate assembly 150 | Texas Instruments | 54 LS 367 |
| Interface data tri-state gate assembly 152 | Texas Instruments | 54 LS 367 |
| Tri-state gates 106,108,110 and 112 | Texas Instruments | 54 LS 367 |
| RAM arbitor unit 104 | | use random logic |
| Buffer unit 140 | | standard unit |
| Status decoder 116 | Texas Instruments | 54 LS 138 |

In FIG. 4, the graph shows the typical output refreshment logic sequence. The graph includes a first curve 254, which shows the real time clock sequence versus time. The graph also includes a second curve 256, which shows the corresponding event sequence versus time and which demonstrates the timing sequence of digital to analog converter 10.

Curve 256 indicates various intervals, which include, loading of digital to dc channel 1 interval 258, doing calculations on the next channel 2 interval 260, closing the output switch of channel 1 interval 262, doing the internal BITE checks interval 264, and opening the channel 1 switch interval 266.

According to the invention, converter 10 provides novel features as indicated hereafter.

1. Converter 10, which provides accurate, multiplexed, ac output conversions, can be built for a lower cost than prior art converters.

2. Converter 10, which includes sample and hold amplifiers, and modulator and filter and buffer amplifiers, that are relatively inaccurate components, provides relatively accurate digital to analog conversions for both ac and dc operations.

3. Converter 10 utilizes an analog to digital converter and digital correction devices to provide error correction of analog signals.

4. Converter 10 uses a common digital to dc converter portion with an ac multiplex unit, instead of individual prior art digital to analog converters in each ac output channel.

While it is apparent that the embodiment of the invention herein disclosed is calculated to fulfill the objects of the invention, modifications can be made thereto without departing from the proper scope of the claims. For example, synchro outputs can be provided by converter 10, by using E ref TAN $\theta$ and E ref as inputs to a Scott T unit to provide a three-wire synchro output, and by using additional card decoding and a specific digital data format. As a further example, redundancy techniques can be provided by using a second digital to analog converter to provide outputs when the first digital to analog converter 10 has failed.

What is claimed is:

1. A digital to analog converter responsive to input digital command signals and including error compensation and being adapted to employ an analog to digital converter having an ac or dc mode of operation, comprising:

an arithmetic logic unit adapted to connect to the analog to digital converter, having a first input for receiving digital correction signals from the analog to digital converter for error compensation, and having a second input for receiving the input digital command signals, a digital to dc converter portion coupled to the arithmetic logic unit, having an input for receiving corrected input digital command signals from the arithmetic logic unit, and a multiplex circuit means coupled to the digital to dc converter portion and adapted to connect to the analog to digital converter, wherein the multiplex circuit means includes:

an ac multiplex circuit means having a plurality of ac channels and an ac multiplex unit for ac operation, and each channel of the ac multiplex circuit means includes a sample and hold amplifier, a capacitor coupled to the sample and hold amplifier, and a modulator assembly coupled to the sample and hold amplifier and coupled to the ac multiplex unit, said modulator assembly including a modular section and a filter section and a buffer section, and a dc multiplex circuit means having a plurality of dc channels and a dc multiplex unit for dc operation, and each channel of the dc multiplex circuit means includes a sample and hold amplifier coupled to the dc multiplex unit, and a capacitor coupled to the sample and hold amplifier, and said ac multiplex unit and said dc multiplex unit each being arranged to couple a selected channel of the ac multiplex circuit means or a selected channel of the dc multiplex circuit means to the analog to digital converter.

2. A digital to analog converter as claimed in claim 1, wherein:

the arithmetic logic unit includes switch means arranged to couple either the ac multiplex circuit means or the dc multiplex circuit means to the digital to dc converter portion, and the arithmetic logic unit includes, a microprocessor assembly and a program memory assembly arranged to control said digital to dc converter portion, wherein said microprocessor assembly comprises, a microprocessor unit and a status decoder and a crystal oscillator, and is arranged to connect to a real time clock through a clock input line, and wherein said program memory assembly comprises, a read only memory unit, a random access memory storage unit, an address storage and select unit, and a random access memory arbitor unit.

* * * * *